(12) United States Patent
Lee et al.

(10) Patent No.: US 9,653,637 B2
(45) Date of Patent: May 16, 2017

(54) AIR COOLED PHOTOVOLTAIC CELLS

(76) Inventors: William Edward Lee, Kailua, HI (US);
Robert F. Pienkowski, Chicago, IL (US)

( * ) Notice: Subject to any disclaimer, the term of this patent is extended or adjusted under 35 U.S.C. 154(b) by 1295 days.

(21) Appl. No.: 12/633,109

(22) Filed: Dec. 8, 2009

(65) Prior Publication Data

US 2010/0139738 A1 Jun. 10, 2010

Related U.S. Application Data

(60) Provisional application No. 61/121,115, filed on Dec. 9, 2008.

(51) Int. Cl.
*H01L 31/052* (2014.01)
*H02S 20/00* (2014.01)
*H02S 40/42* (2014.01)

(52) U.S. Cl.
CPC .......... *H01L 31/0521* (2013.01); *H02S 20/00* (2013.01); *H02S 40/425* (2014.12); *Y02E 10/50* (2013.01)

(58) Field of Classification Search
CPC ...... H01L 31/052; H02K 29/10; B60K 16/00; F03G 6/001; F03G 6/00; F21S 9/03; F21V 29/02; Y02T 10/90; H02S 10/12; H02S 40/425; H02S 20/00; Y02E 10/50
USPC ................... 136/243, 251, 259, 246
See application file for complete search history.

(56) References Cited

U.S. PATENT DOCUMENTS

| 1,993,419 | A | * | 3/1935 | Stalker | 244/208 |
| 3,325,930 | A | * | 6/1967 | Braeutigam | 40/473 |
| 3,331,462 | A | * | 7/1967 | Wernicke | 180/129 |
| 3,353,191 | A | * | 11/1967 | Dahly | 2/171.3 |
| 3,442,469 | A | * | 5/1969 | Davis | 244/23 C |
| 3,572,613 | A | * | 3/1971 | Porter | B64C 39/06 244/12.2 |
| 3,774,865 | A | * | 11/1973 | Pinto | 244/23 C |
| 4,053,327 | A | * | 10/1977 | Meulenberg, Jr. | H01L 31/0547 136/256 |

(Continued)

FOREIGN PATENT DOCUMENTS

| DE | 10014924 A1 | 9/2001 |
| JP | 08-286250 A | 11/1996 |

(Continued)

*Primary Examiner* — Tien Dinh
*Assistant Examiner* — Vicente Rodriguez
(74) *Attorney, Agent, or Firm* — Ash Tankha; Lipton, Weinberger & Husick

(57) ABSTRACT

An apparatus is provided that comprises photovoltaic cells provided on a first rotatable member, an electric motor having an axial shaft, and a second rotatable member provided with an impeller. The photovoltaic cells capture and convert the solar energy into electrical energy. The electric motor is connected to and is in electric communication with the photovoltaic cells for powering the electric motor. The electric motor converts the electrical energy into mechanical energy for rotating the photovoltaic cells in a first direction about a central axis and for rotating the axial shaft connected to an impeller in a second direction about the central axis. The rotating axial shaft rotates the impeller at high revolutions per minute which generates a flow of air that is directed to the rotating photovoltaic cells on the first rotatable member. The photovoltaic cells are cooled by the air-flow and operate at a lower temperature.

8 Claims, 18 Drawing Sheets

(56) References Cited

U.S. PATENT DOCUMENTS

| | | | |
|---|---|---|---|
| 4,065,873 A | | 1/1978 | Jones |
| 4,204,357 A | | 5/1980 | Harrington |
| 4,634,343 A | * | 1/1987 | Nakamats ..................... 416/3 |
| 4,674,708 A | * | 6/1987 | del Castillo ................ 244/12.2 |
| 4,680,815 A | * | 7/1987 | Hirsch et al. ................ 2/171.3 |
| 4,778,128 A | * | 10/1988 | Wright et al. ............. 244/23 C |
| 4,893,356 A | * | 1/1990 | Waters .......................... 2/171.3 |
| 5,203,521 A | * | 4/1993 | Day ............................ 244/12.2 |
| 5,297,759 A | * | 3/1994 | Tilbor et al. .............. 244/17.11 |
| 5,349,975 A | | 9/1994 | Valdner |
| 6,032,291 A | * | 3/2000 | Asenguah et al. ............ 2/171.3 |
| 6,122,773 A | * | 9/2000 | Katz ............................ 2/171.3 |
| 6,308,912 B1 | * | 10/2001 | Kirjavainen ................ 244/12.2 |
| 6,760,925 B1 | * | 7/2004 | Maxwell ...................... 2/171.3 |
| 6,837,457 B2 | * | 1/2005 | Kirjavainen .............. 244/17.23 |
| 7,255,623 B2 | * | 8/2007 | Davis .................... A63H 27/04 |
| | | | 244/23 C |
| 7,331,064 B1 | * | 2/2008 | Quintal ........................ 2/209.13 |
| 7,332,842 B2 | * | 2/2008 | Kasahara et al. ............... 310/84 |
| 7,347,758 B2 | * | 3/2008 | Moore ........................... 446/47 |
| 7,559,506 B2 | * | 7/2009 | Kissel, Jr. ............. B64C 39/001 |
| | | | 244/17.11 |
| 2008/0047270 A1 | | 2/2008 | Gilbert |

FOREIGN PATENT DOCUMENTS

| | | |
|---|---|---|
| WO | WO2004080556 A2 | 9/2004 |
| WO | WO2005-117142 A1 | 12/2005 |
| WO | WO2008-088311 A2 | 7/2008 |
| WO | WO2008-101419 A2 | 8/2008 |
| WO | WO2010077620 A2 | 7/2010 |

* cited by examiner

AIR COOLED PHOTOVOLTAIC CELLS

CROSS REFERENCE TO RELATED APPLICATIONS

This application claims the benefit of provisional patent application No. 61/121,115 titled "Solar Powered Flying Disc Frisbee & High Speed Rotation Solar Photovoltaic Cells", filed on Dec. 9, 2008 in the United States Patent and Trademark Office.

The specification of the above referenced patent application is incorporated herein by reference in its entirety.

BACKGROUND

Solar technology deals with the use of solar energy for a multitude of practical applications. Photovoltaic cells convert solar energy directly into electrical energy using the photovoltaic effect which is well known in the art.

Typical solar powered devices comprise multiple stationary photovoltaic cells positioned on a surface. The photovoltaic cells capture solar energy and convert the captured solar energy into electrical energy. In some cases, the captured solar energy overheats the photovoltaic cells resulting in lower solar energy conversion efficiency by the photovoltaic cells. Solar energy comprises packets of energy, for example, photons. When photons strike a photovoltaic cell, the photons may be reflected or absorbed, or they may pass right through the photovoltaic cell. The photovoltaic cell is made out of a semiconductor material. When a photon is absorbed by the photovoltaic cell, electrons from the atoms of the semiconductor material are dislodged from their position. These electrons travel toward the front surface of the photovoltaic cell and flow on the front surface of the photovoltaic cell. This flow of electrons generates electrical energy.

The temperature of the photovoltaic cell increases due to factors, for example, solar energy trapped inside the photovoltaic cells, etc. The increase in temperature of the photovoltaic cells decreases the efficiency of the photovoltaic cells. The decrease in efficiency is because molecular motion in the semiconductor material of the photovoltaic cell becomes more intense and the movement of electrons is impeded. Furthermore, when the temperature of the photovoltaic cell rises, the semiconductor material of the photovoltaic cell may expand or contract, thereby reducing the lifespan of the photovoltaic cells. Hence, there is a need for cooling the surface of the photovoltaic cells. Stationary photovoltaic cells do not produce a cooling effect. There is a long felt but unresolved need for an apparatus that cools the photovoltaic cells by directing air on the photovoltaic cells, thereby removing the heat from the surface of the photovoltaic cells.

The amount of electrical energy generated by the photovoltaic cell is directly proportional to the amount of solar energy captured by the photovoltaic cells. The amount of energy the photovoltaic cell captures is a function of both the size or surface area of the photovoltaic cell and the intensity or brightness of the sunlight that strikes the photovoltaic cell. Often, the surface area of the photovoltaic cells is increased to increase the amount of electrical energy output of the photovoltaic cells. Photovoltaic cells with larger surface areas are expensive. Therefore, there is a long felt but unresolved need for an apparatus that enables photovoltaic cells to operate at a lower temperature to increase the electrical energy output of the photovoltaic cells.

SUMMARY OF THE INVENTION

This summary is provided to introduce a selection of concepts in a simplified form that are further described in the detailed description of the invention. This summary is not intended to identify key or essential inventive concepts of the claimed subject matter, nor is it intended for determining the scope of the claimed subject matter.

The apparatus and method disclosed herein addresses the above stated needs for enabling photovoltaic cells to operate at a lower temperature and increase the amount of electrical energy output. The continuous rotation of the photovoltaic cells at high revolutions per minute (rpm) and forced airflow past the rotating photovoltaic cells ensures that the photovoltaic cells do not overheat and therefore increases their efficiency.

The apparatus disclosed herein comprises photovoltaic cells, an electric motor having an axial shaft, and an impeller. The photovoltaic cells are provided on a rotatable member. The photovoltaic cells capture solar energy and convert the solar energy into electrical energy. The electric motor is in electric communication with the photovoltaic cells for powering the electric motor. The axial shaft extends axially from the electric motor to an impeller. The axial shaft is powered by the electric motor. The impeller is coaxially connected to the axial shaft. The rotation of the axial shaft by the electric motor produces an upward air-flow by the rotating impeller past the rotating photovoltaic cells and allows the rotating photovoltaic cells to operate at a lower temperature.

In an embodiment, the apparatus disclosed herein comprises a first rotatable member and a second rotatable member. The photovoltaic cells are provided on the first rotatable member. The first rotatable member is, for example, a generally disc-shaped rotatable member. The first rotatable member comprises an upper section of a generally circular shape and a curved side wall. The upper section is defined between an inner periphery and an outer periphery. The curved side wall of the first rotatable member is connected to the outer periphery of the upper section to define an annular space within the first rotatable member. The inner periphery of the upper section defines an axial opening of a generally circular shape for housing the photovoltaic cells. The photovoltaic cells are positioned within the axial opening of the first rotatable member and on the upper section of the first rotatable member.

In an embodiment, one or more concentrator lenses are mounted on the photovoltaic cells for concentrating and directing the solar energy into the photovoltaic cells. The photovoltaic cells provided on the first rotatable member capture solar energy and convert the solar energy into electrical energy. The electrical energy is transferred to the electric motor, for example, a direct current (DC) motor, having an axial shaft. The electric motor is connected to and is in electric communication with the photovoltaic cells. The electric motor is coaxially disposed in the annular space defined by the first rotatable member. The electric motor converts the electrical energy produced by the photovoltaic cells into mechanical energy for rotating the photovoltaic cells about a central axis and for rotating the axial shaft connected to the impeller about the central axis. The electric motor rotates the photovoltaic cells provided on the first rotatable member, for example, in a clockwise direction, about the central axis and rotates the axial shaft connected to the impeller, for example, in a counterclockwise direction, about the central axis.

The axial shaft of the electric motor has a first end and a second end. The first end of the axial shaft is rotatably connected within the electric motor and the second end of the axial shaft is connected to the impeller provided on the second rotatable member. The second rotatable member is, for example, a generally disc-shaped rotatable member. The rotating axial shaft rotates the impeller and the second rotatable member at high revolutions per minute (rpm) about the central axis. The rotation of the impeller generates a flow of air.

The impeller comprises a central hub, an axial groove axially positioned in the central hub, and multiple blades positioned on a periphery of the central hub. The axial groove receives the second end of the axial shaft. The central hub accommodates the electric motor. The blades direct air in an upward direction for facilitating propulsion of the apparatus. The second rotatable member comprises a bottom section of a generally circular shape and a curved side wall. The bottom section of the second rotatable member is defined between an inner periphery and an outer periphery. The curved side wall of the second rotatable member is connected to the outer periphery of the bottom section to define an annular space within the second rotatable member. The second rotatable member houses the impeller in an axial opening of a generally circular shape defined by the inner periphery of the bottom section.

Multiple vents are configured on the first rotatable member and on the second rotatable member for allowing air to pass through the first rotatable member and the second rotatable member respectively. The rotating impeller generates a flow of air at an increased velocity. This generates a lifting force that propels the apparatus in an upward direction. The air-flow is directed to the rotating photovoltaic cells on the first rotatable member. The air flows out of the apparatus through the vents configured on the first rotatable member. The photovoltaic cells on the first rotatable member are cooled by the air-flow which enables the photovoltaic cells to operate at a lower temperature.

BRIEF DESCRIPTION OF THE DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and instrumentalities disclosed herein.

DETAILED DESCRIPTION OF THE INVENTION

Figure 1:
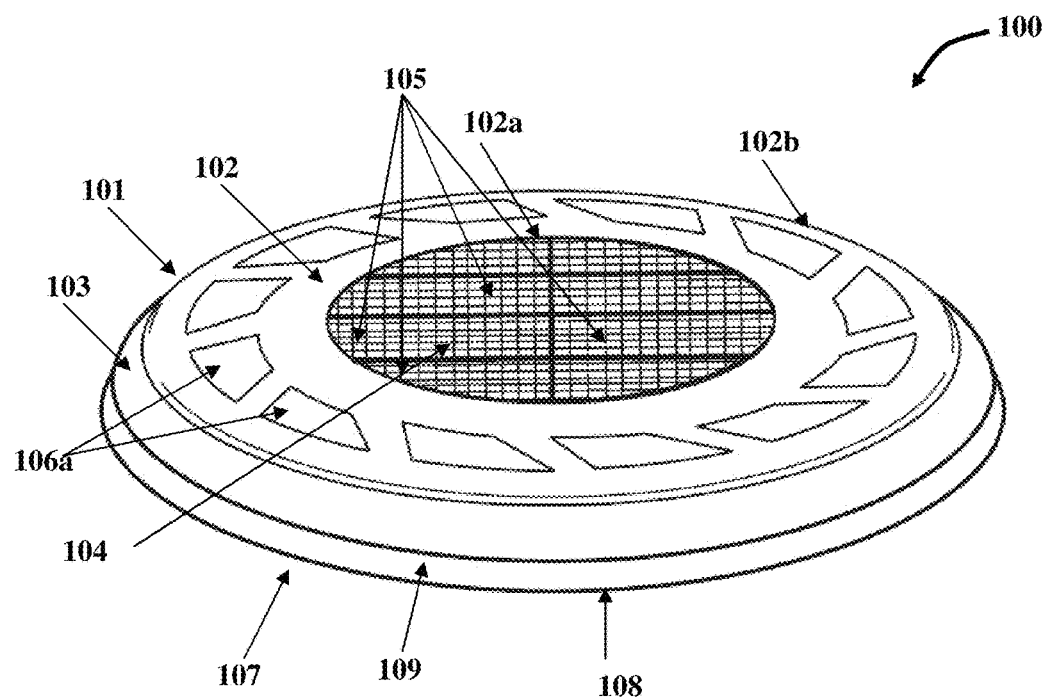
FIG. 1 exemplarily illustrates a top perspective view of an apparatus that operates at a lower temperature.

FIG. 1 exemplarily illustrates a top perspective view of an apparatus 100 that operates at a lower temperature and thereby increases the photovoltaic cell solar energy conversion efficiency. The apparatus 100 disclosed herein comprises photovoltaic cells 105, a first rotatable member 101, and a second rotatable member 107. The photovoltaic cells 105 are provided on the first rotatable member 101. The photovoltaic cells 105 capture solar energy and convert the solar energy into electrical energy by the photovoltaic effect. The photovoltaic cell 105 is made out of a semiconductor material. When a photon is absorbed by the photovoltaic cell 105, electrons from the atoms of the semiconductor material are dislodged from their position. These electrons travel toward the front surface of the photovoltaic cell 105 and flow on the front surface of the photovoltaic cell 105. This flow of electrons generates electrical energy.

Figure 3:
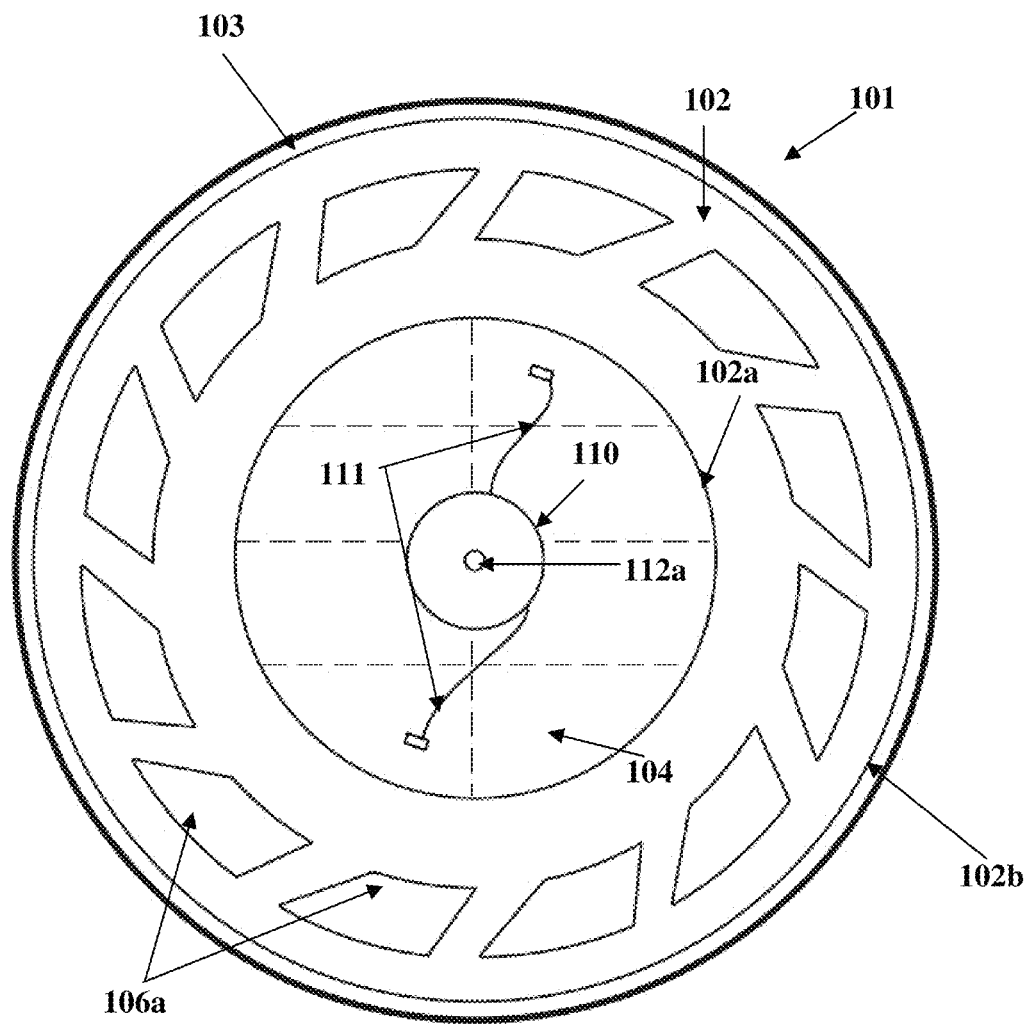
FIG. 3 exemplarily illustrates a bottom orthogonal view of the first rotatable member of the apparatus.
Figure 4:
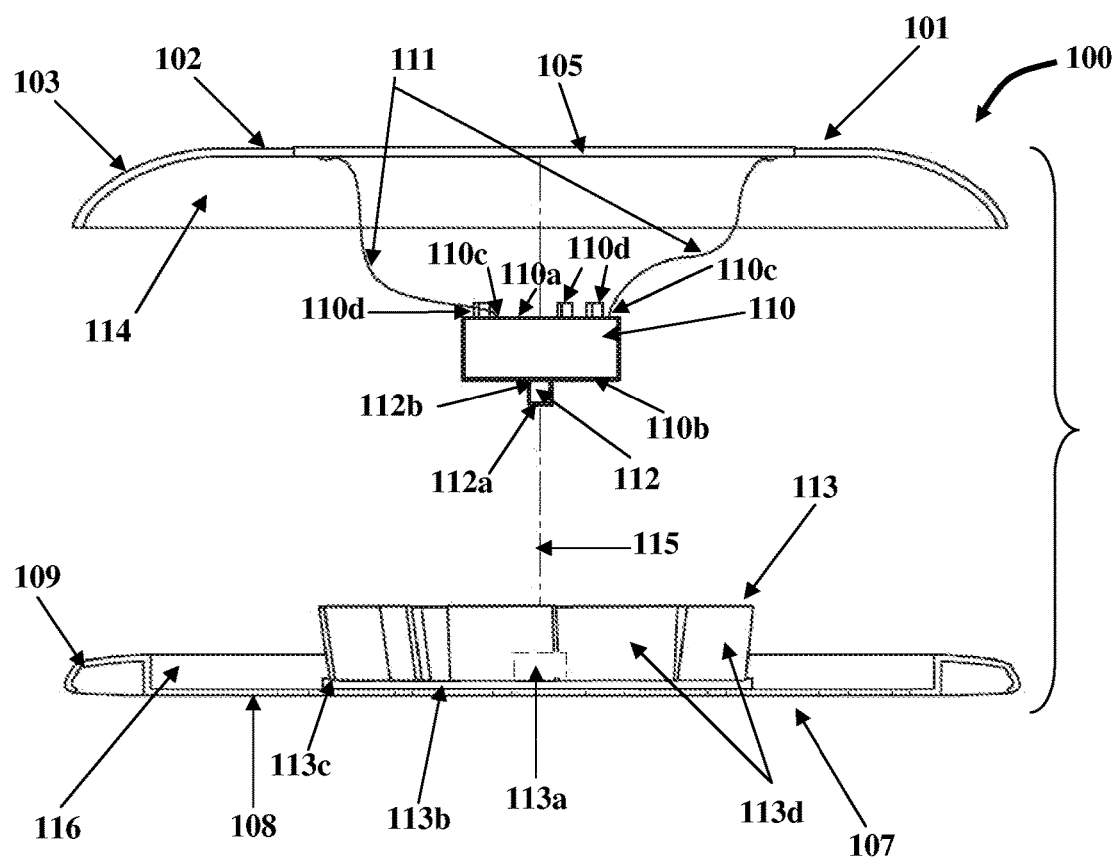
FIG. 4 exemplarily illustrates an exploded view of the apparatus.
Figure 5:
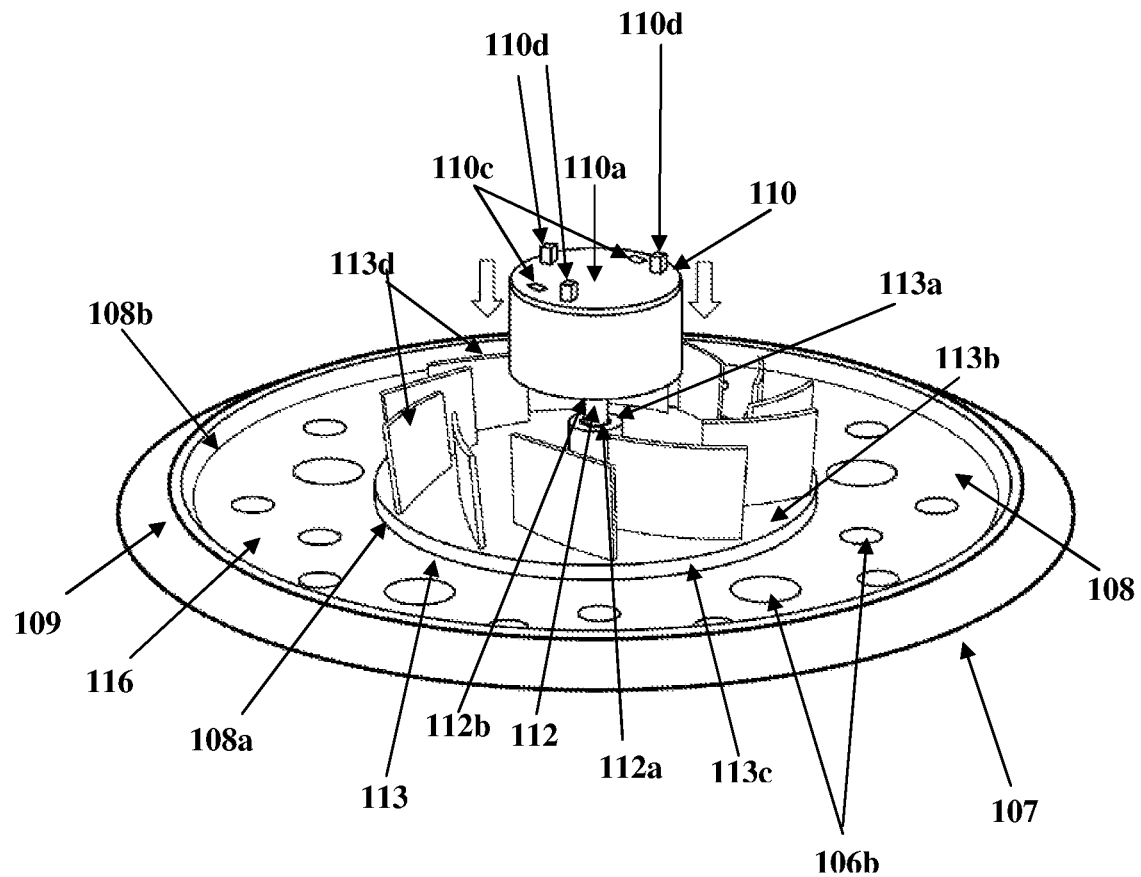
FIGS. 5-6 exemplarily illustrate an axial shaft of the electric motor inserted into an axial groove of an impeller provided on a second rotatable member of the apparatus.

The electrical energy is transferred to an electric motor 110 provided with an axial shaft 112 as exemplarily illustrated in FIGS. 3-5. The electric motor 110 is, for example, a direct current (DC) motor. The axial shaft 112 is powered by the electric motor 110. The electric motor 110 is in electric communication with the photovoltaic cells 105 for powering the electric motor 110. The axial shaft 112 extends axially from the electric motor 110 to an impeller 113 as exemplarily illustrated in FIG. 4. The impeller 113 is coaxially connected to the axial shaft 112 as exemplarily illustrated in FIG. 5. The electric motor 110 converts the electrical energy produced by the photovoltaic cells 105 into mechanical energy for rotating the photovoltaic cells 105 in a first direction, for example, a clockwise direction of rotation, about a central axis 115. The rotation of the axial shaft 112 by the electric motor 110 rotates the second rotatable member 107 via the impeller 113 in a second direction counter to the first direction about the central axis 115. For example, the electric motor 110 rotates the photovoltaic cells 105 provided on the first rotatable member 101 in a clockwise direction about the central axis 115 and rotates the axial shaft 112 connected to the second rotatable member 107 via the impeller 113 in a counterclockwise direction about the central axis 115.

Rotation of the axial shaft 112 in the electric motor 110 generates a counter force which in turn rotates components of the electric motor 110 other than the axial shaft 112 in a direction counter to the direction of the axial shaft 112. The counter force is called "counter torque effect". Counter torque effect is a rotational force that opposes the direction of rotation of the axial shaft 112. In this case, the rotational force is the rotation of the electric motor 110 in a direction opposite to the direction of the axial shaft 112. To avoid any loss in transfer of rotational energy imparted by the electric energy to the axial shaft 112, the electric motor 110 is almost always rigidly fixed. In an embodiment of the apparatus 100 disclosed herein, the axial shaft 112 is connected to the impeller 113 on the second rotatable member 107, wherein the axial shaft 112 is protruding from one end 110b of the electric motor 110. The opposing end 110a of the electric motor 110 without the protruding axial shaft 112 is rigidly connected to the photovoltaic cells 105. Accordingly, when the electrical energy is transferred to the electric motor 110 from the photovoltaic cells 105, the axial shaft 112 rotates in one direction, causing the rigidly connected impeller 113 on the second rotatable member 107 to rotate in the same direction as that of the axial shaft 112. The counter force generated by the rotation of the axial shaft 112 causes the electric motor 110 and the photovoltaic cells 105 connected to the electric motor 110 to rotate in a direction opposite to the direction of rotation of the axial shaft 112.

The rotating axial shaft 112 rotates the impeller 113 provided on the second rotatable member 107 at high revolutions per minute (rpm) which generates a flow of air. As used herein, high rpm refers to speed of rotation faster than 1 revolution per minute, for example, in a range of 1-1000 revolutions per minute. The air-flow generated by the impeller 113 is directed to the rotating photovoltaic cells 105 on the first rotatable member 101. The photovoltaic cells 105 on the first rotatable member 101 are therefore cooled by the ambient air as the photovoltaic cells 105 rotate and are also cooled by the air-flow generated by the rotating impeller 113 and directed towards and past the rotating photovoltaic cells 105 and therefore operate at a lower temperature.

In an embodiment, the apparatus 100 disclosed is not provided with the second rotatable member 107. In this embodiment, the impeller 113 is positioned below and in close proximity to the photovoltaic cells 105 and is rotated by a second motor in communication with the impeller 113 that is powered by the photovoltaic cells 105. The rotation of the impeller 113 by the second motor generates air-flow that is directed towards and past the photovoltaic cells 105.

Due to the lowered temperature of the photovoltaic cells 105, an increased number of photons from the solar energy are absorbed by the photovoltaic cells 105, thereby dislodging an increased number of electrons from the atoms of the semiconductor material. These electrons then flow toward the front surface of the photovoltaic cells 105. The lowered operating temperature of the photovoltaic cells 105 facilitates better flow of electrons on the front surface of the photovoltaic cells 105, thereby increasing the amount of electrical energy output of the photovoltaic cells 105.

Figure 2:
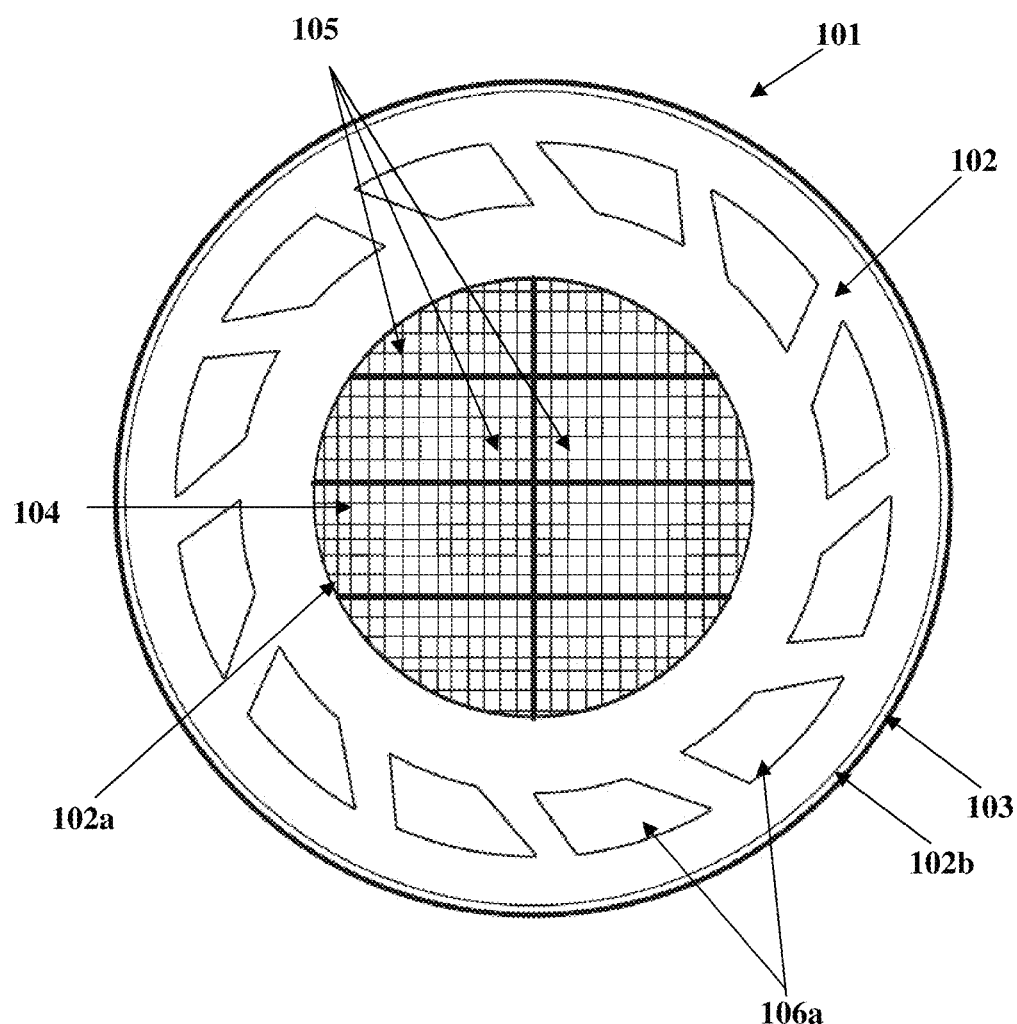
FIG. 2 exemplarily illustrates a top orthogonal view of a first rotatable member of the apparatus.

As illustrated in FIGS. 1-2, the first rotatable member 101 is, for example, a generally disc-shaped rotatable member. The first rotatable member 101 comprises an upper section 102 of a generally circular shape, a curved side wall 103, and an axial opening 104 of a generally circular shape. The upper section 102 is defined between an inner periphery 102a and an outer periphery 102b. A top orthogonal view of the first rotatable member 101 of the apparatus 100 is exemplarily illustrated in FIG. 2.

The curved side wall 103 of the first rotatable member 101 is connected to the outer periphery 102b of the upper section 102 to define an annular space 114 within the first rotatable member 101, as exemplarily illustrated in FIG. 4. The axial opening 104 of the first rotatable member 101 is defined by the inner periphery 102a of the upper section 102 for housing the photovoltaic cells 105.

The photovoltaic cells 105 are positioned within the axial opening 104 of the first rotatable member 101 and on the upper section 102 of the first rotatable member 101. In an embodiment, the photovoltaic cells 105 are positioned on a plane or a member that has a shape other than a circular shape, for example, an oval shaped member. In another embodiment, the photovoltaic cells 105 are provided on a generally circular panel 105 positioned in the axial opening 104 defined by the inner periphery 102a of the upper section 102 of the first rotatable member 101 as exemplarily illustrated in FIGS. 1-2. In another embodiment, the photovoltaic cells 105 are provided on a ring shaped panel 119 and on multiple rectangular panels 120 as disclosed in the detailed description of FIGS. 11-13.

FIG. 3 exemplarily illustrates a bottom orthogonal view of the first rotatable member 101 of the apparatus 100. As illustrated in FIG. 3, the electric motor 110 provided with the axial shaft 112 is connected to the first rotatable member 101 that houses the photovoltaic cells 105 positioned within the axial opening 104 of the first rotatable member 101. The electric motor 110 is in electric communication with the photovoltaic cells 105. The photovoltaic cells 105 transfer the electrical energy to the electric motor 110. The electrical connection allows flow of electrical energy from the photovoltaic cells 105 into the electric motor 110. The electric motor 110 converts the electrical energy produced by the photovoltaic cells 105 into mechanical energy. The electric motor 110 is coaxially disposed in the annular space 114 defined by the first rotatable member 101 as exemplarily illustrated in FIG. 4. The electric motor 110 rotates the axial shaft 112 about the central axis 115. The direction of rotation can be reversed by reversing the leads 111 connected to the electric motor terminals 110c as illustrated in FIGS. 3-4. The electric motor terminals 110c are, for example, a positive terminal and a negative terminal.

As illustrated in FIGS. 1-3, the apparatus 100 further comprises multiple vents 106a configured on the first rotatable member 101. The vents 106a allow the airflow generated by the impeller 113 to pass through the first rotatable member 101 for cooling the photovoltaic cells 105 on the first rotatable member 101. The vents 106a on the upper section 102 of the first rotatable member 101 allow the air to flow out into the atmosphere.

FIG. 4 exemplarily illustrates an exploded view of the apparatus 100, showing the connection of the axial shaft 112 to the electric motor 110. The axial shaft 112 is, for example, a drive shaft. The axial shaft 112 connects the electric motor 110 to the impeller 113 housed in the second rotatable member 107. The axial shaft 112 rotates the impeller 113 about the central axis 115. The axial shaft 112 has a first end 112b and a second end 112a. The first end 112b of the axial shaft 112 is rotatably connected within the electric motor 110. The second end 112a of the axial shaft 112 is connected to the impeller 113. The impeller 113 comprises a central hub 113b, an axial groove 113a axially positioned in the central hub 113b, and multiple blades 113d positioned on a periphery 113c of the central hub 113b. The axial groove 113a receives the second end 112a of the axial shaft 112. The central hub 113b accommodates the electric motor 110. When the impeller 113 is rotated by the electric motor 110 via the axial shaft 112, the blades 113d of the impeller 113 generate an air-flow using the air present within the apparatus 100, and direct the air-flow in an upward direction towards and past the rotating photovoltaic cells 105 on the first rotatable member 101 for facilitating cooling of the rotating photovoltaic cells 105.

FIG. 4 also illustrates protrusions 110d on the upper surface 110a of the electric motor 110. The protrusions 110d are located adjacent to the electric motor terminals 110c.

Figure 6:
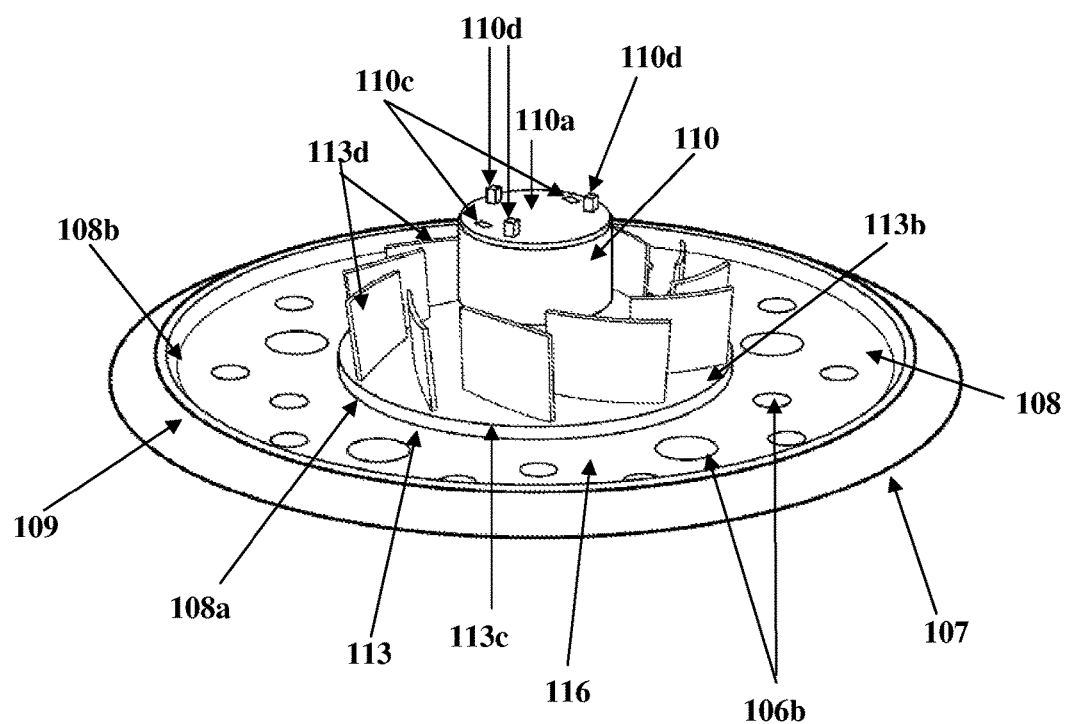

FIGS. 5-6 exemplarily illustrate an axial shaft 112 of the electric motor 110 inserted into an axial groove 113a of an impeller 113 provided on a second rotatable member 107 of the apparatus 100. The second end 112a of the axial shaft 112 is inserted into the axial groove 113a of the impeller 113 provided on the second rotatable member 107. The electric motor 110 fits securely within the impeller 113 on the second rotatable member 107 of the apparatus 100 as illustrated in FIG. 6.

Figure 7:
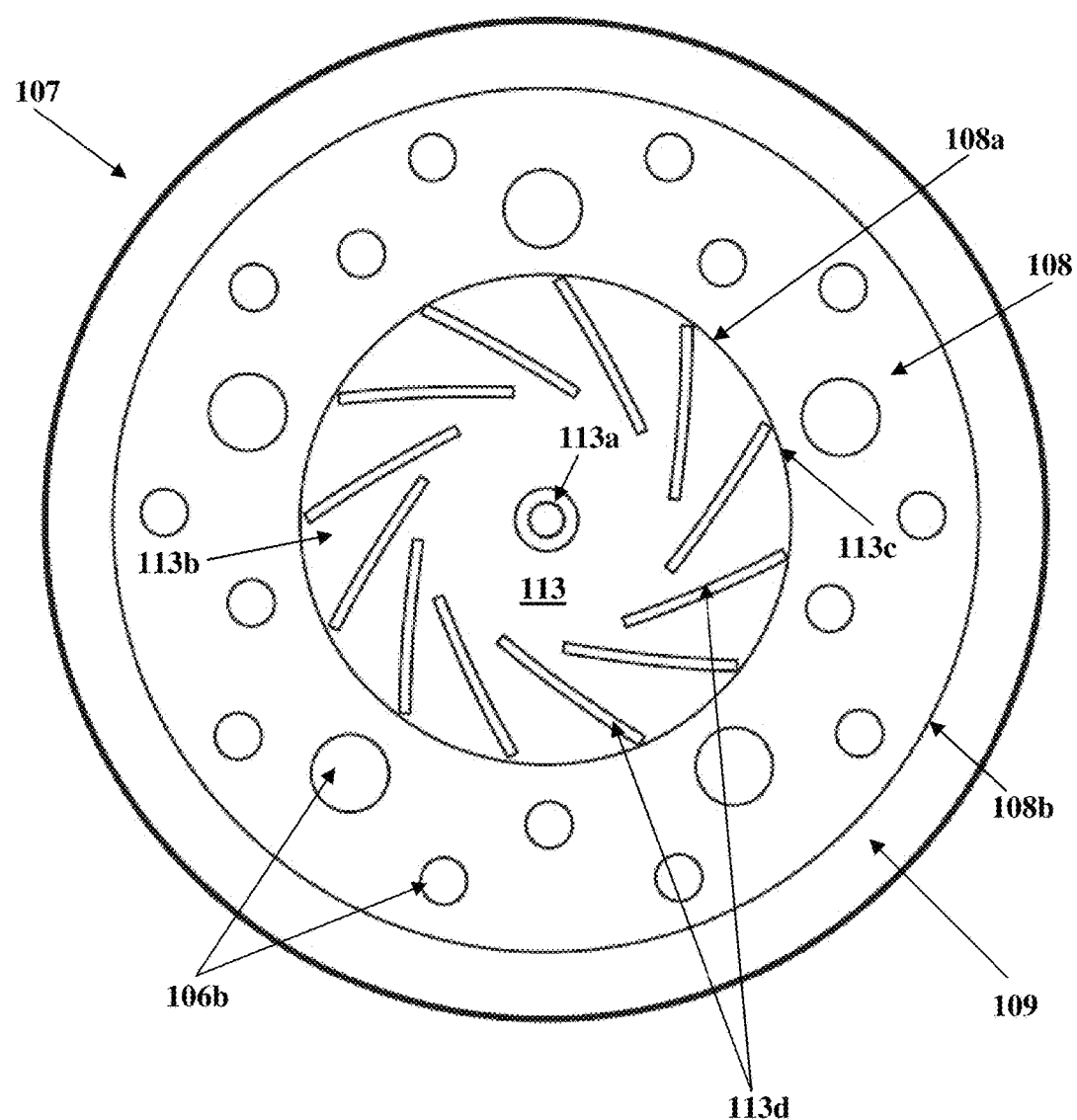
FIG. 7 exemplarily illustrates a top orthogonal view of the second rotatable member of the apparatus.

FIG. 7 exemplarily illustrates a top orthogonal view of the second rotatable member 107 of the apparatus 100. The second rotatable member 107 is, for example, a generally disc-shaped rotatable member. The second rotatable member 107 comprises a bottom section 108 of a generally circular shape and a curved side wall 109. The bottom section 108 is defined between an inner periphery 108a and an outer periphery 108b. As illustrated in FIGS. 5-6, the curved side wall 109 of the second rotatable member 107 is connected to the outer periphery 108b of the bottom section 108 to define an annular space 116 within the second rotatable member 107.

Figure 8:
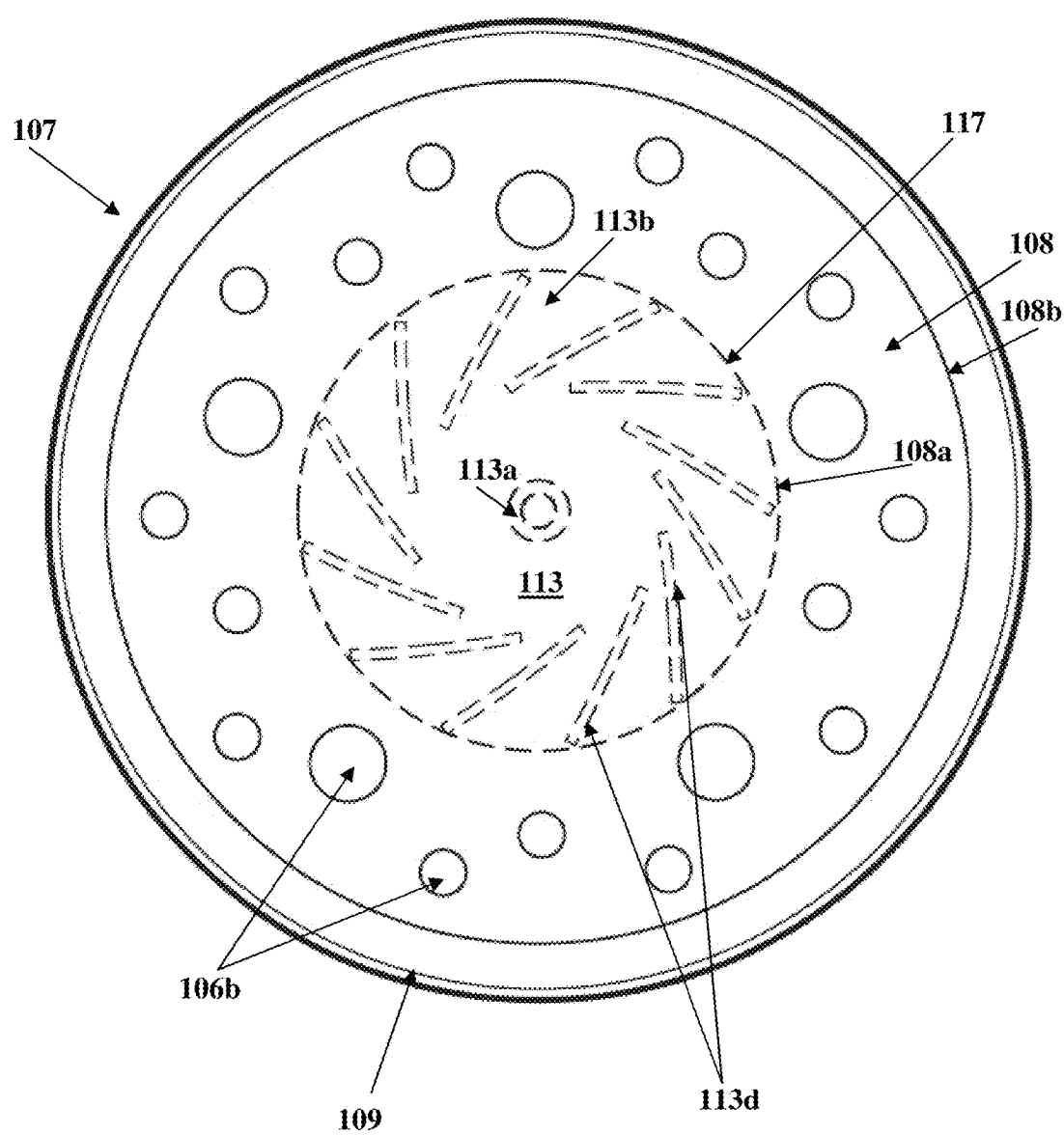
FIG. 8 exemplarily illustrates a bottom orthogonal view of the second rotatable member of the apparatus.

FIG. 8 exemplarily illustrates a bottom orthogonal view of the second rotatable member 107 of the apparatus 100. As illustrated in FIG. 8, an axial opening 117 of a generally circular shape is defined by the inner periphery 108a of the bottom section 108 of the second rotatable member 107. The second rotatable member 107 houses the impeller 113 in the axial opening 117 of the second rotatable member 107. The central hub 113b of the impeller 113 is connected and rests within the axial opening 117 of the second rotatable member 107. The impeller 113 rotates the second rotatable member 107 about the central axis 115 and generates a lifting force that propels the apparatus 100 in an upward direction on generation of air-flow by the rotating impeller 113. The electric motor 110 causes the first rotatable member 101 on which the photovoltaic cells 105 are positioned to rotate in a first direction and the second rotatable member 107 and the impeller 113 on the second rotatable member 107 in a second direction counter to the first direction about the central axis 115. The continuous rotation of the first rotatable member 101 housing the photovoltaic cells 105 and the impeller 113 in opposite directions at high rpm generates a high velocity air-flow which removes the heat generated in the photovoltaic cells 105 and minimizes heat build-up in the photovoltaic cells 105.

As illustrated in FIGS. 5-8, the apparatus 100 further comprises multiple vents 106b configured on the bottom section 108 of the second rotatable member 107. The vents 106b configured on the bottom section 108 of the second rotatable member 107 allow air to pass through the second rotatable member 107.

As disclosed in the detailed description of FIGS. 1-3, the electric motor 110 is connected to the first rotatable member 101 that houses the photovoltaic cells 105 positioned within the axial opening 104. The electric motor 110 is provided with an axial shaft 112. The first end 112b of the axial shaft 112 is connected to the electric motor 110 and the second end 112a of the axial shaft 112 extends down to the impeller 113 and terminates in the axial groove 113a of the impeller 113. The impeller 113 is rigidly connected to the second rotatable member 107, and therefore the rotation of the impeller 113 also rotates the second rotatable member 107.

When the apparatus 100 is placed on a surface, for example a person's hand with the second rotatable member 107 of the apparatus 100 resting on the person's hand and exposed to sun light, the photovoltaic cells 105 on the first rotatable member 101 transfers electric energy to the electric motor 110. When the electrical energy produced by the photovoltaic cells 105 is transferred to the electric motor 110, the electric motor 110 rotates about the axial shaft 112 in one direction about the axis of the axial shaft 112. The electric motor 110 thereby rotates the photovoltaic cells 105 provided on the first rotatable member 101 in a first direction, for example, a clockwise direction, about the central axis 115. Since the rotational force of the electric motor 110 takes the path of least resistance, the electric motor 110 rotates the first rotatable member 101 but does not rotate the impeller 113 housed on the second rotatable member 107 resting on the person's hand. When the apparatus 100 is released from the person's hand into the air, the second rotatable member 107 is no longer restrained and the rotational force of the axial shaft 112 rotates the impeller 113 connected to the second rotatable member 107 and therefore rotates the second rotatable member 107 about the central axis 115. When the apparatus 100 is released into the air, the first rotatable member 101 housing the photovoltaic cells 105 rotates in a first direction, for example, a clockwise direction, and the second rotatable member 107 rotates in a second direction, for example, a counterclockwise direction, about the central axis 115.

Figure 9:
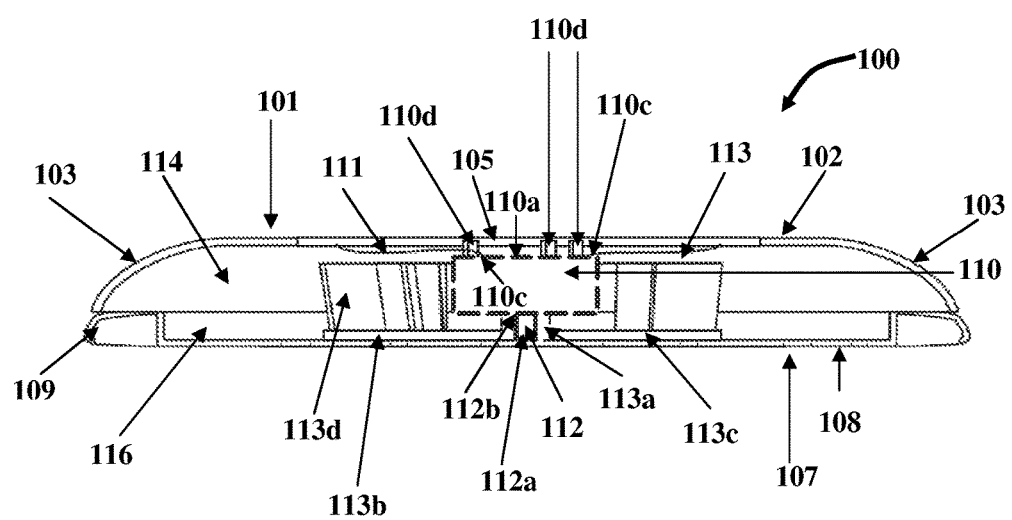
FIG. 9 exemplarily illustrates a sectional view of the apparatus.

FIG. 9 exemplarily illustrates a sectional view of the apparatus 100. As illustrated in FIG. 9, the first rotatable member 101 which houses the photovoltaic cells 105 is connected to the electric motor 110 which is provided with the axial shaft 112. The axial groove 113a of the impeller 113 receives the second end 112a of the axial shaft 112 and allows the electric motor 110 disposed within the annular space 114 of the first rotatable member 101 to securely fit within the impeller 113 provided on the second rotatable member 107. The electric motor 110 converts the electrical energy produced by the photovoltaic cells 105 into mechanical energy for rotating the photovoltaic cells 105 about a central axis 115 and rotating the axial shaft 112 connected to impeller 113 on the second rotatable member 107 in opposite directions about the central axis 115. The impeller 113 rotating at high rpm generates high velocity air-flow. The high velocity air-flow is directed towards the first rotatable member 101 by the blades 113d of the impeller 113. The air flows past the rotating photovoltaic cells 105. The flow of the air past the rotating photovoltaic cells 105 further lowers the temperature of the photovoltaic cells 105 by removing heat generated in the photovoltaic cells 105 and minimizing heat build-up in the photovoltaic cells 105. This prevents over heating of the photovoltaic cells 105.

Figure 10:
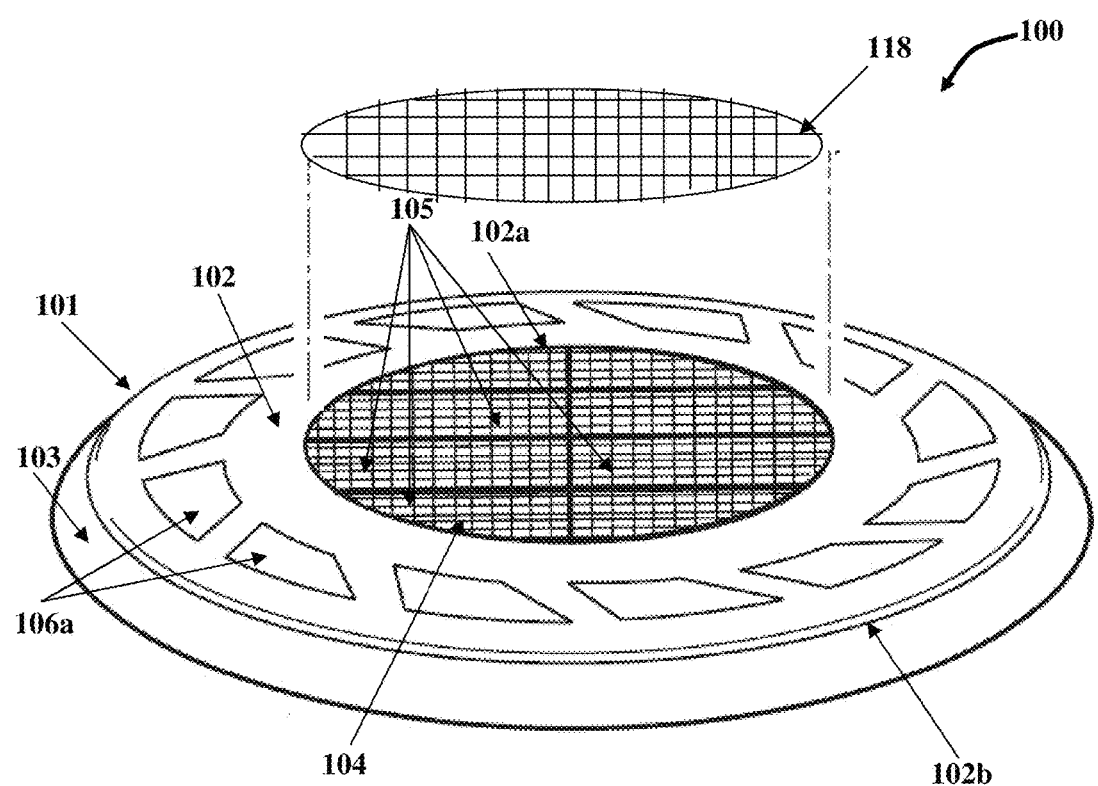
FIG. 10 exemplarily illustrates a top perspective view of the apparatus, showing mounting of concentrator lenses on the photovoltaic cells.

FIG. 10 exemplarily illustrates a top perspective view of the apparatus 100, showing the mounting of concentrator lenses 118 on the photovoltaic cells 105. In an embodiment, multiple concentrator lenses 118, for example, Fresnel lenses are mounted on the photovoltaic cells 105. The concentrator lenses 118 concentrate and direct the solar energy into the photovoltaic cells 105 for increasing the amount of electrical energy output of the photovoltaic cells 105.

Figure 11:
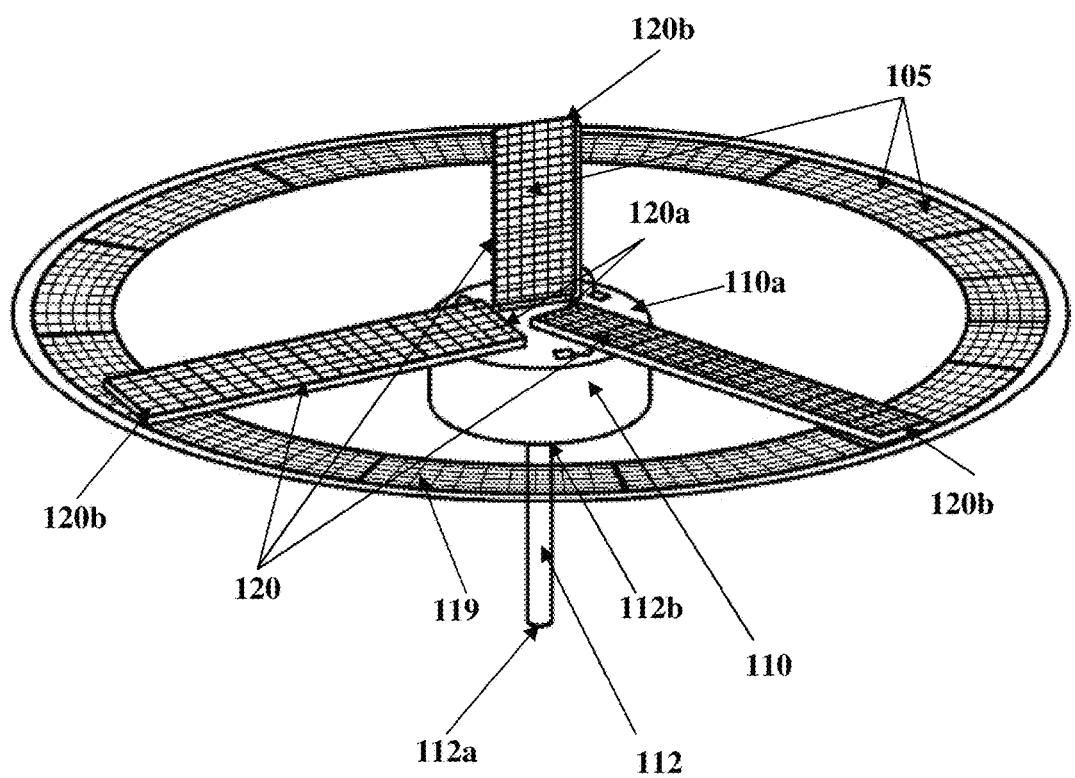
FIG. 11 exemplarily illustrates a top perspective view of the first rotatable member of the apparatus, showing an embodiment of positioning the photovoltaic cells on the first rotatable member.
Figure 12:
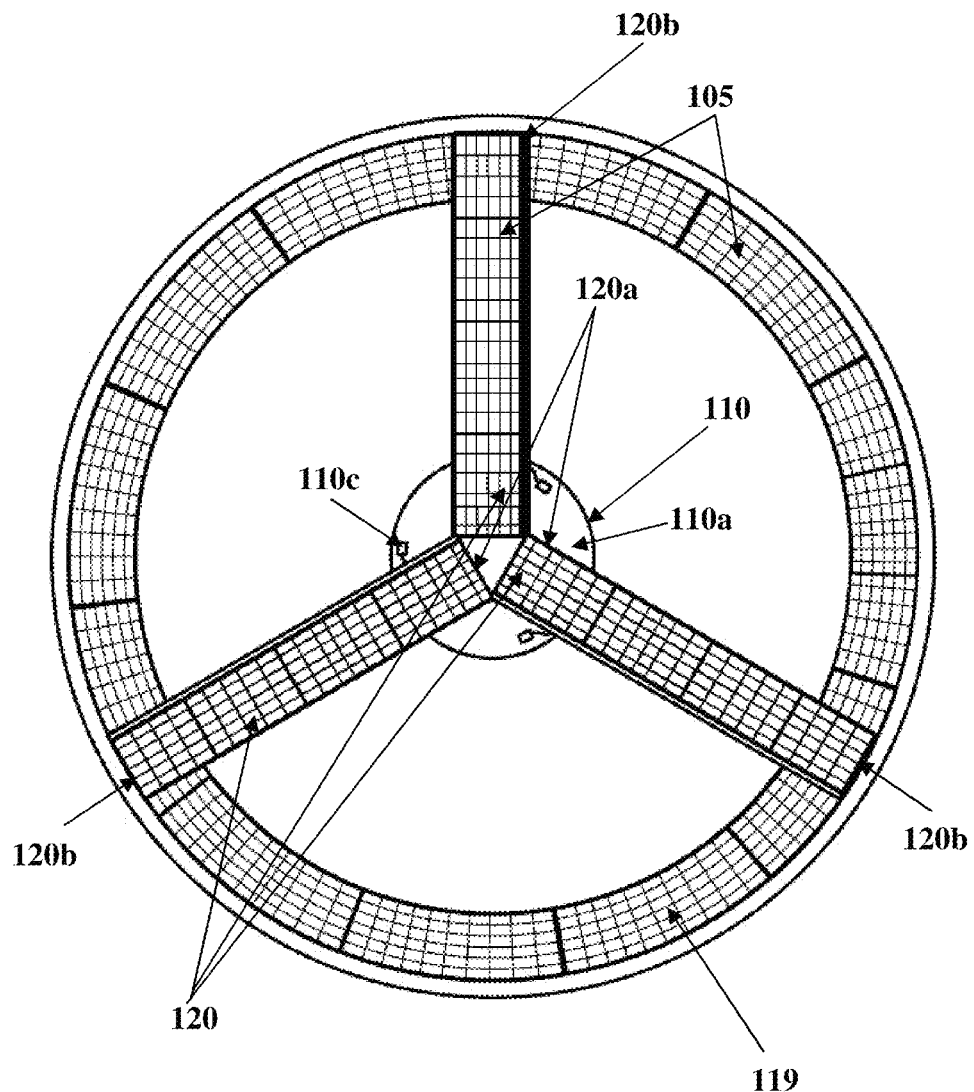
FIG. 12 exemplarily illustrates a top orthogonal view of the first rotatable member of the apparatus, showing an embodiment of positioning the photovoltaic cells on the first rotatable member.
Figure 13:
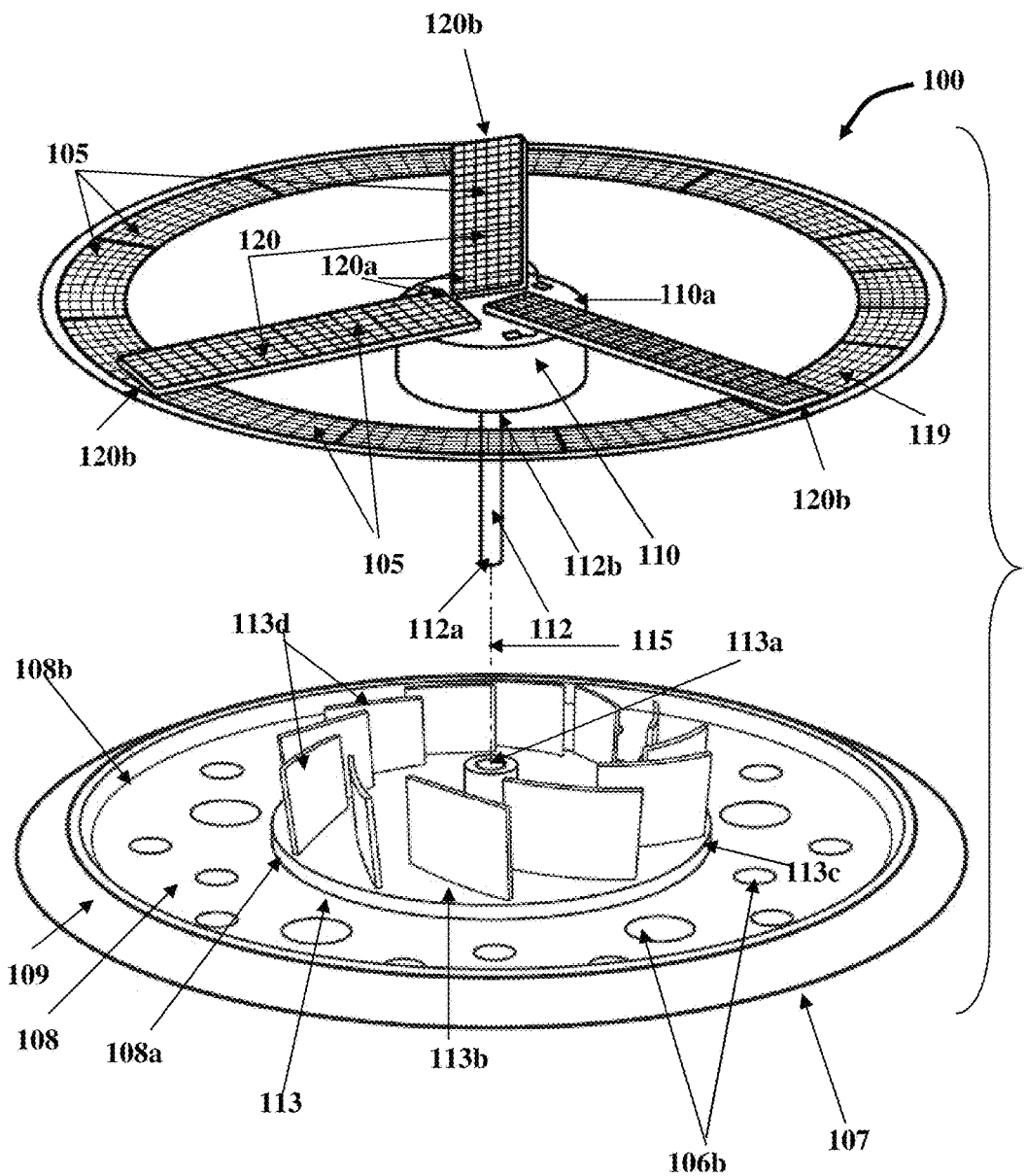
FIG. 13 exemplarily illustrates an exploded view of an embodiment of the apparatus.

FIG. 11 exemplarily illustrates a top perspective view of the first rotatable member 101 of the apparatus 100, showing an embodiment of positioning the photovoltaic cells 105 on the first rotatable member 101. In this embodiment, the photovoltaic cells 105 are provided on a ring shaped panel 119 and on multiple rectangular panels 120. FIGS. 11-13 exemplarily illustrate three radially positioned rectangular panels 120. The ring shaped panel 119 is positioned on the upper section 102 of the first rotatable member 101. Each of the rectangular panels 120 has a first end 120a and a second end 120b. The first end 120a of each of the rectangular panels 120 is electrically connected to the upper surface 110a of the electric motor 110. The second end 120b of each of the rectangular panels 120 is connected to the ring shaped panel 119. A top orthogonal view of the first rotatable member 101 of the apparatus 100, showing this embodiment of positioning the photovoltaic cells 105 on the first rotatable member 101 is exemplarily illustrated in FIG. 12.

FIG. 13 exemplarily illustrates an exploded view of an embodiment of the apparatus 100. In FIG. 13, the photovoltaic cells 105 are positioned on the first rotatable member 101 as disclosed in the detailed description of FIGS. 11-12. The panels 119 and 120 of photovoltaic cells 105 are connected to the upper surface 110a of the electric motor 110 having the axial shaft 112. The second end 112a of the axial shaft 112 of the electric motor 110 is inserted in the axial groove 113a of the impeller 113.

Figure 14:
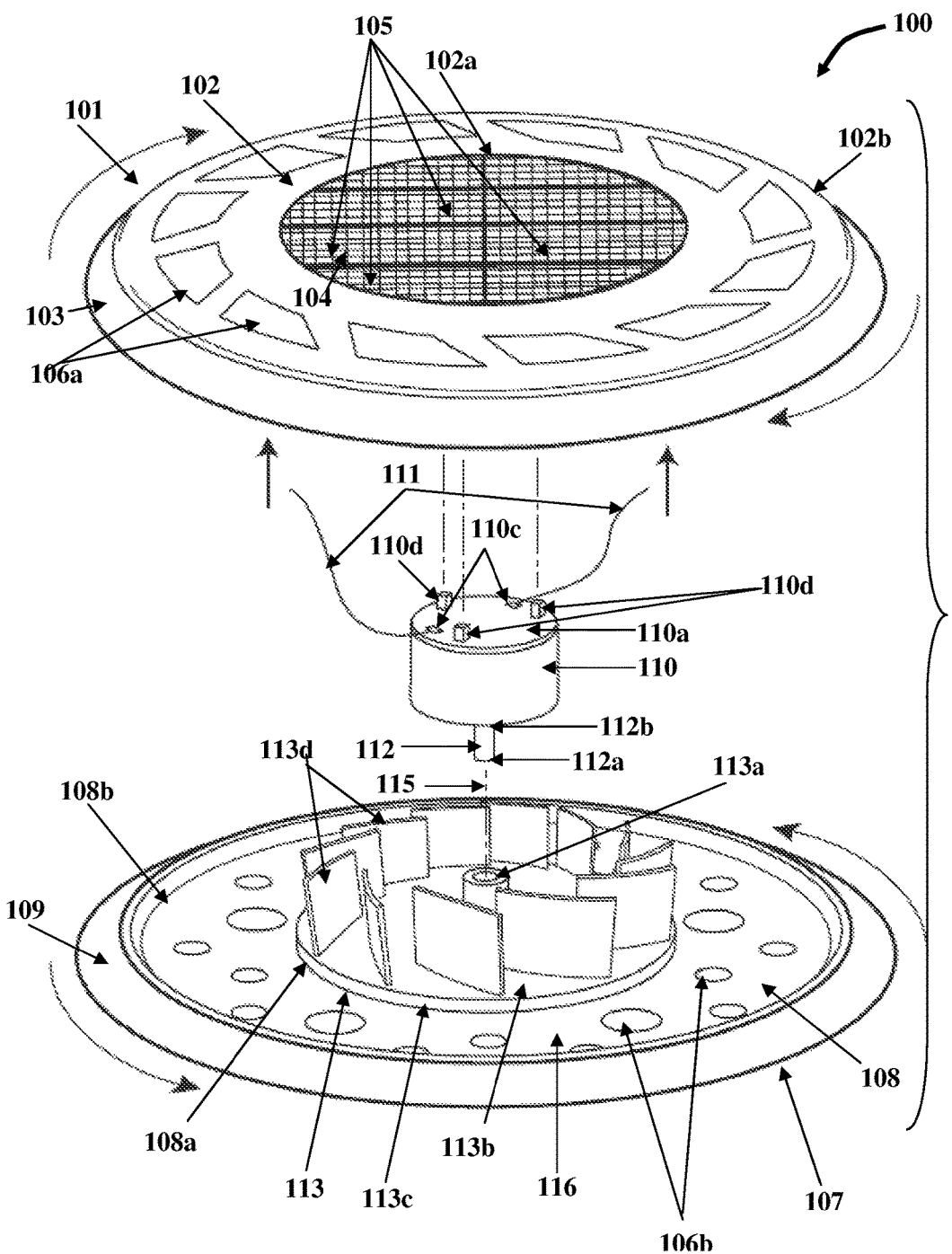
FIGS. 14-15 exemplarily illustrate an exploded view of the apparatus, showing the rotation of the first rotatable member and the second rotatable member about a central axis.
Figure 15:
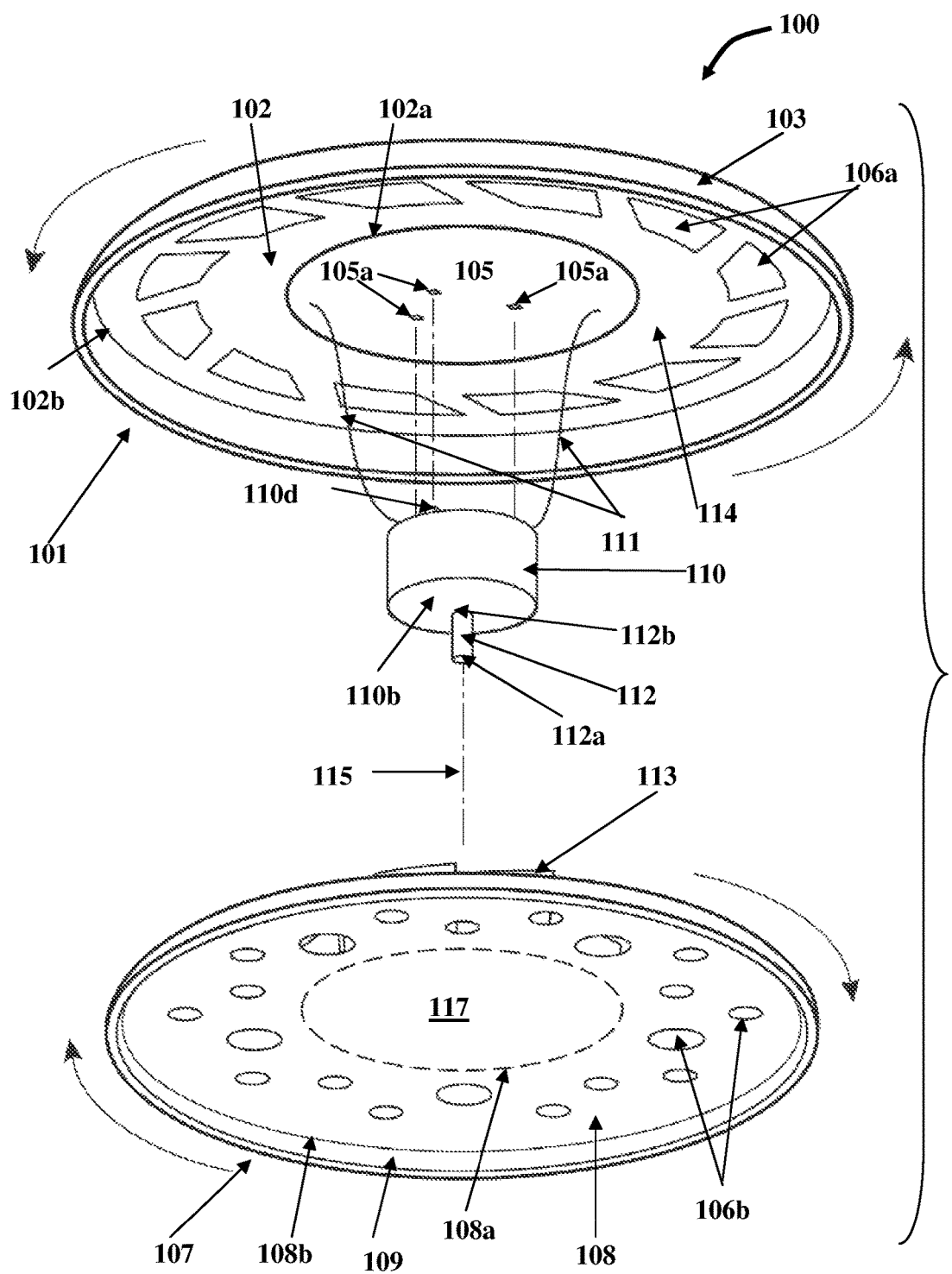
Figure 18:
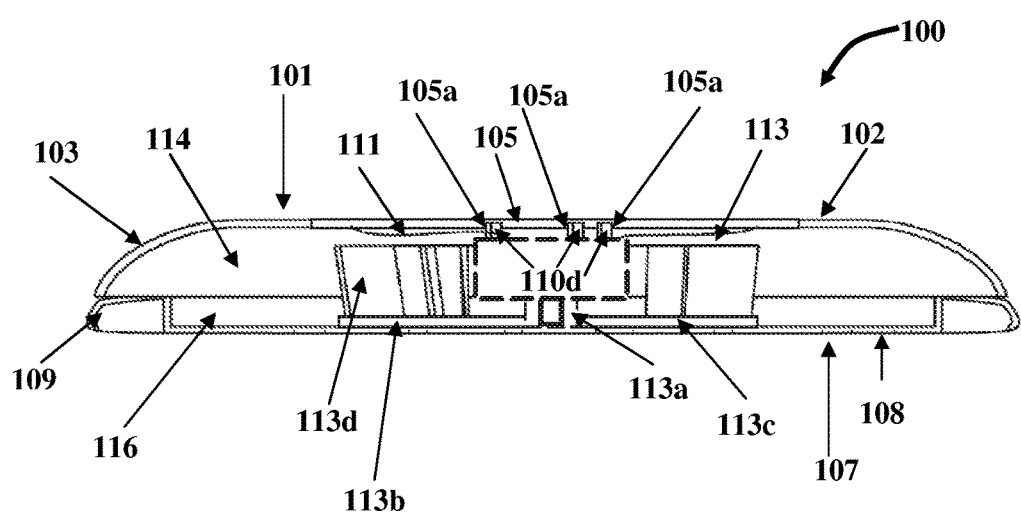
FIG. 18 exemplarily illustrates a sectional view of the apparatus showing engagement of protrusions on the upper surface of the electric motor in the slots on the underside of the photovoltaic cells.

FIGS. 14-15 exemplarily illustrate an exploded view of the apparatus 100, showing the rotation of the first rotatable member 101 and the second rotatable member 107 about a central axis 115. The photovoltaic cells 105 capture solar energy, convert the solar energy into electrical energy, and transfer the electrical energy to the electric motor 110. The electric motor 110 converts the electrical energy into mechanical energy and rotates the photovoltaic cells 105 in a first direction about a central axis 115, and rotates the axial shaft 112 connected to the second rotatable member 107 in a second direction counter to the first direction about the central axis 115. The photovoltaic cells 105 also comprise slots 105a on their backside, as exemplarily illustrated in FIG. 15. The protrusions 110d on the upper surface 110a of the electric motor 110 are configured to be accommodated inside the slots 105a to form a rigid connection between the photovoltaic cells 105 and the opposing end 110a of the electric motor 110. FIG. 18 exemplarily illustrates a sectional view of the apparatus 100 showing the accommodation of the protrusions 110d inside the slots 105a on the underside of the photovoltaic cells 105. The number of slots 105a on the backside of the photovoltaic cells 105 preferably corresponds to the number of protrusions 110d on the upper surface 110a of the electric motor 110. FIGS. 4-6, 9, 14-16 and 18 exemplarily illustrate the presence of three slots 105a and three protrusions 110d.

Figure 16:
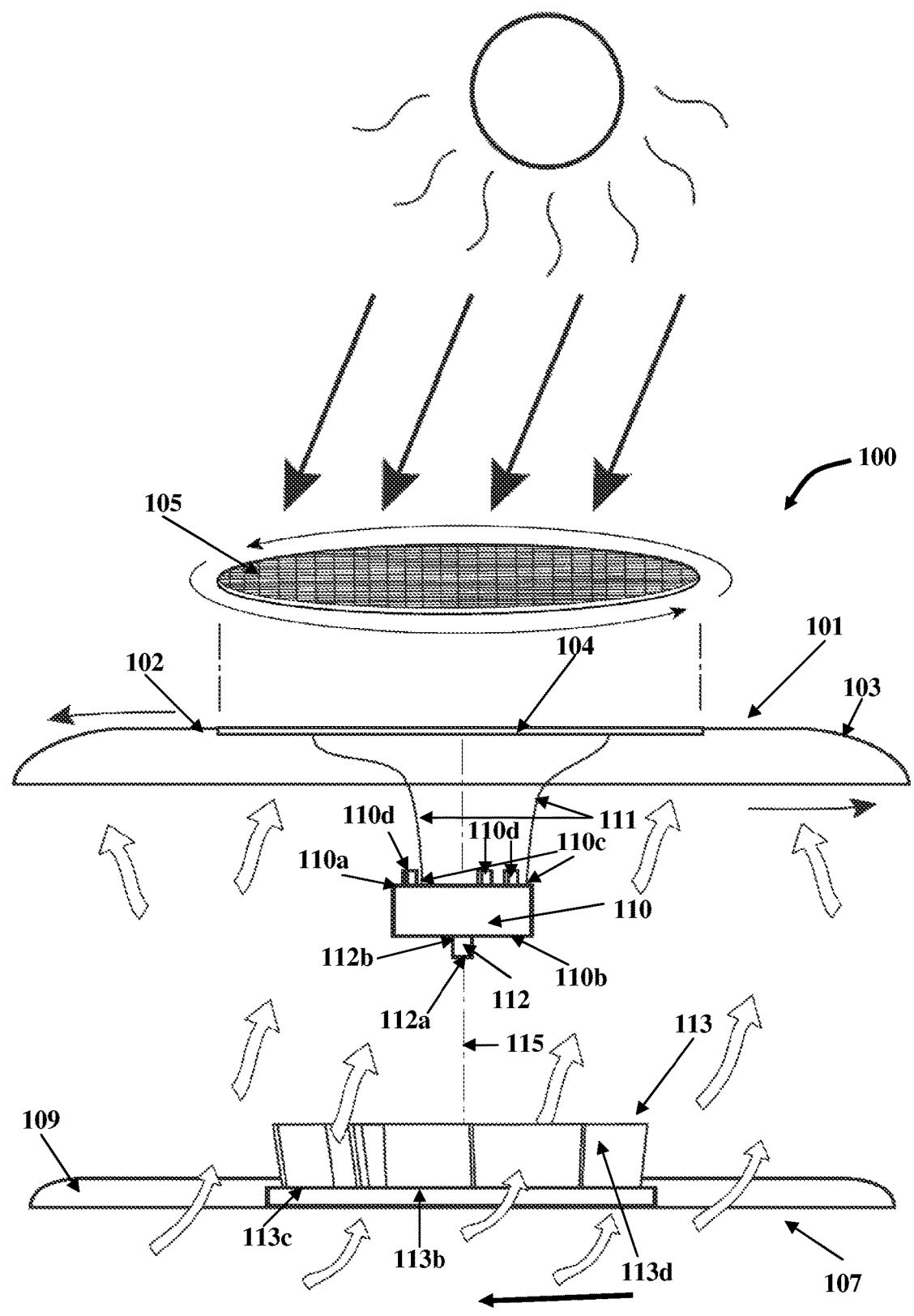
FIG. 16 exemplarily illustrates the operation of the apparatus.

FIG. 16 exemplarily illustrates the operation of the apparatus 100. As disclosed in the detailed description of FIGS. 1-9, the photovoltaic cells 105 provided on the first rotatable member 101 capture solar energy from sunlight and convert the solar energy to electrical energy which is transferred to the electric motor 110. The electric motor 110 rotates about the axial shaft 112 in one direction about the axis of the axial shaft 112 and therefore rotates the photovoltaic cells 105, for example, in a counterclockwise direction, about the central axis 115. The electric motor 110 also rotates the axial shaft 112, for example, in a clockwise direction and therefore rotates the impeller 113 and the second rotatable member 107 in the clockwise direction. As exemplarily illustrated in FIG. 16, the air from the atmosphere enters through the vents 106b configured on the bottom section 108 of the second rotatable member 107. The rotating impeller 113 generates the flow of the air and increases the velocity of air. The increased velocity air-flow is directed to the photovoltaic cells 105 on the first rotatable member 101 and flows through the vents 106a on the upper section 102 of the first rotatable member 101.

In an embodiment, an energy storage device (not shown), for example, a battery and a switch are provided in addition to the photovoltaic cells 105 in the apparatus 100. As used herein, the term "switch" refers to an electrical component that can break an electrical circuit, interrupting the current or diverting it from one conductor to another. In the presence of sunlight, the switch may be configured to transfer the electrical energy obtained from the photovoltaic cells 105 to the electric motor 110 and also to the energy storage device thereby charging the energy storage device. In the absence of sunlight, the switch may be configured in such a way that the electrical energy stored in the charged energy storage device is transferred to the electric motor 110.

Figure 17:
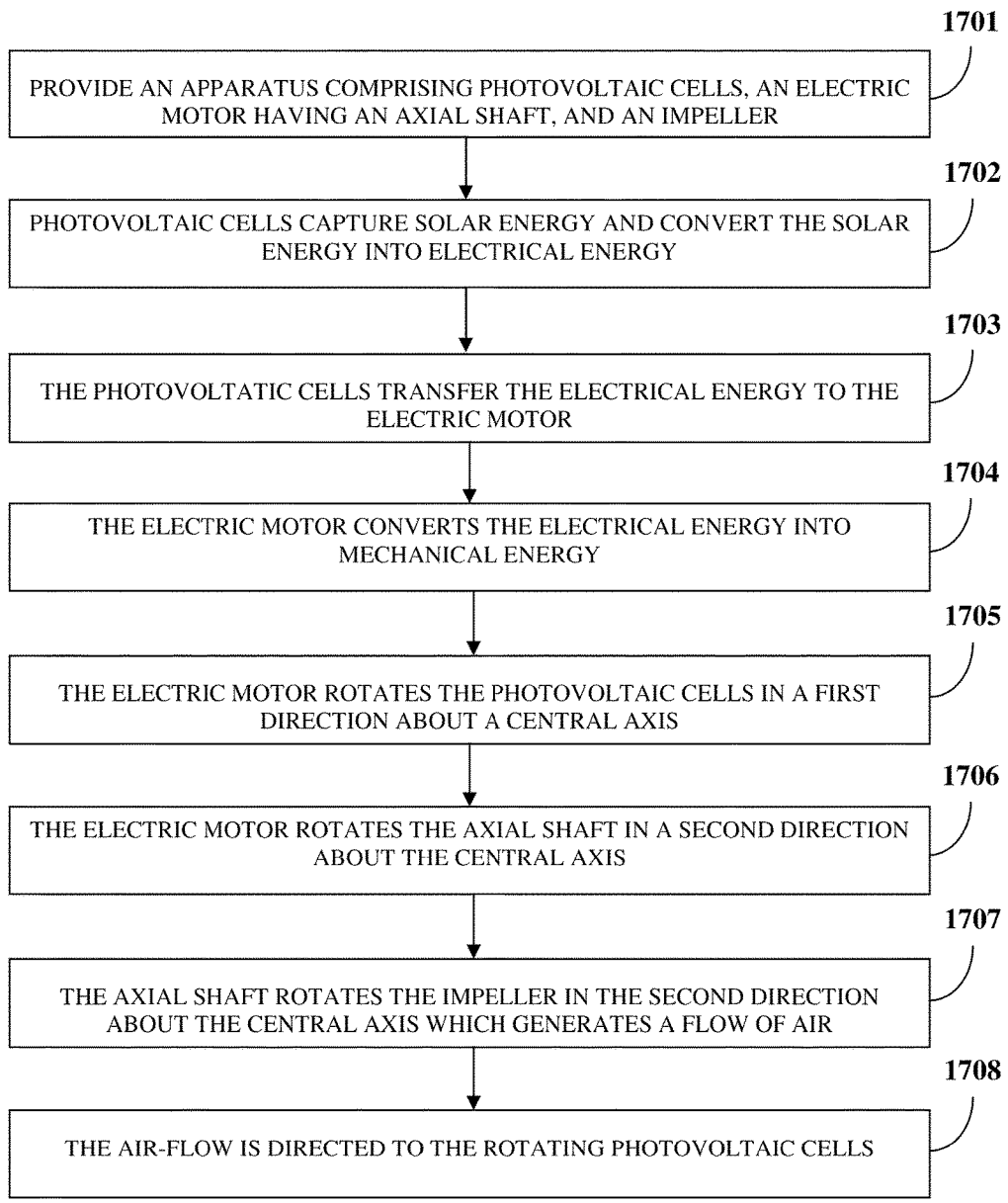
FIG. 17 illustrates a method of operating photovoltaic cells at a lower temperature.

FIG. 17 illustrates a method of operating photovoltaic cells 105 at a lower temperature. An apparatus 100 as illustrated and disclosed in the detailed description of FIGS. 1-16 is provided 1701. The photovoltaic cells 105 capture 1702 solar energy and convert the captured solar energy into electrical energy. The photovoltaic cells 105 transfer 1703 the electrical energy to the electric motor 110.

The electric motor 110 converts 1704 the electrical energy into mechanical energy and rotates 1705 photovoltaic cells 105 in a first direction, for example, a clockwise direction, about a central axis 115. The rotation of the photovoltaic cells 105 in the first direction about the central axis 115 also rotates the first rotatable member 101 in the first direction about the central axis 115.

Furthermore, the electric motor 110 rotates 1706 the axial shaft 112 connected to the impeller 113 in a second direction, for example, a counterclockwise direction, about the central axis 115. The axial shaft 112 therefore rotates 1707 the impeller 113 in the second direction about the central axis 115. The impeller 113 rotates the second rotatable member 107 in the second direction about the central axis 115.

Air from the atmosphere enters through the vents 106b into the apparatus 100 as exemplarily illustrated in FIG. 16. The impeller 113 generates a high velocity air-flow. This generates a lifting force that propels the apparatus 100 in an upward direction. The impeller 113 directs 1708 the air-flow to the rotating photovoltaic cells 105 on the first rotatable member 101. The air flows out of the apparatus 100 through the vents 106a configured on the first rotatable member 101. This cools the photovoltaic cells 105 and enables the photovoltaic cells 105 to operate at a lower temperature.

Consider an example where the apparatus 100 disclosed herein is used in a ventilation system. The photovoltaic cells 105 capture solar energy and convert the captured solar energy into electrical energy. The photovoltaic cells 105 then transfer the electrical energy to the electric motor 110 which converts the electrical energy into mechanical energy and rotates the photovoltaic cells 105 in a clockwise direction and the axial shaft 112 in a counterclockwise direction about the central axis 115. The axial shaft 112 rotates the impeller 113 in the counterclockwise direction about the central axis 115 and the impeller 113 rotates the second rotatable member 107 in the counterclockwise direction about the central axis 115. The continuous rotation of the photovoltaic cells 105 at high rpm coupled with the upward flow of air generated by the rotating impeller 113 allows the photovoltaic cells 105 to operate at a lower temperature and increases the efficiency of the photovoltaic cells 105.

The rotating impeller 113 absorbs spent air from within the room. The spent air from within the room flows into the apparatus 100 through the vents 106b provided on the second rotatable member 107. The rotating impeller 113 generates a high velocity air-flow of the spent air and discharges the air to the environment. The blades 113d of the impeller 113 direct the absorbed spent air towards the first rotatable member 101. The absorbed spent air flows past the photovoltaic cells 105 thereby lowering the temperature of the photovoltaic cells 105. The absorbed spent air flows out of the apparatus 100 into the atmosphere through the vents 106a provided on the first rotatable member 101.

The apparatus 100 disclosed herein is used in several flying disc games. For example, the apparatus 100 may be used as a high speed rotatable flying device which is thrown and caught for recreation in games, for example, Frisbee throwing, etc.

The foregoing examples have been provided merely for the purpose of explanation and in no way are to be construed as limiting of the present invention. While the invention has been described with reference to various embodiments, it is understood that the words, which have been used herein, are words of description and illustration, rather than words of limitation. Additionally, although the invention has been described herein with reference to particular means, materials and embodiments, the invention is not intended to be limited to the particulars disclosed herein; rather, the invention extends to all functionally equivalent structures, methods and uses, such as are within the scope of the appended claims. It will be appreciated by those skilled in the art, having the benefit of the teachings of this specification, that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An apparatus for enabling photovoltaic cells to operate at a lower temperature, comprising:
    said photovoltaic cells provided on a first rotatable member, wherein said photovoltaic cells capture solar energy and convert said solar energy into electrical energy, wherein said electrical energy is transferred to an electric motor having an axial shaft;
    said electric motor rigidly connected to and in electric communication with said photovoltaic cells on a first side of said electric motor, wherein said electric motor is coaxially disposed in an annular space defined by said first rotatable member, wherein said axial shaft extends downwards from a second side of said electric motor opposite to said first side and is connected to an impeller, wherein said electric motor converts said electrical energy produced by said photovoltaic cells into mechanical energy for rotating said rigidly connected photovoltaic cells and said first rotatable member about a central axis in a first direction, and wherein said electric motor converts said electrical energy produced by said photovoltaic cells into said mechanical energy for rotating said axial shaft in a second direction counter to said first direction;
    a second rotatable member rigidly connected to said impeller, wherein said rotating axial shaft rotates said impeller and said second rotatable member in said second direction; and
    said first rotatable member and said second rotatable member comprising a plurality of vents, wherein said plurality of vents on said second rotatable member allow air to enter said apparatus from below said apparatus, wherein said impeller generates an air-flow, and wherein said air-flow reaches a top of said apparatus through said plurality of vents on said first rotatable member;
    whereby said photovoltaic cells on said first rotatable member are cooled by said air-flow on top and bottom of said rotating photovoltaic cells, enabling said photovoltaic cells to operate at said lower temperature.

2. The apparatus of claim 1, wherein said first rotatable member comprises a generally circular upper section and a curved side wall, wherein said generally circular upper section is defined between an inner periphery and an outer periphery, wherein said curved side wall of said first rotatable member is connected to said outer periphery of said generally circular upper section to define said annular space within said first rotatable member, and wherein a generally circular axial opening is defined by said inner periphery of said generally circular upper section for housing said photovoltaic cells.

3. The apparatus of claim 2, wherein said photovoltaic cells are positioned within said generally circular axial opening and on said generally circular upper section of said first rotatable member.

4. The apparatus of claim 1, wherein said impeller comprises a central hub, wherein an axial groove is axially positioned in said central hub, wherein said axial groove receives said axial shaft, and wherein a plurality of blades are positioned on a periphery of said central hub.

5. The apparatus of claim 1, wherein said second rotatable member comprises a generally circular bottom section and a curved side wall, wherein said generally circular bottom section is defined between an inner periphery and an outer periphery, and wherein said curved side wall of said second rotatable member is connected to said outer periphery of said generally circular bottom section to define an annular space within said second rotatable member, and wherein a generally circular axial opening is defined by said inner periphery of said generally circular bottom section for housing said impeller.

6. The apparatus of claim 1, wherein one or more concentrator lenses are mounted on said photovoltaic cells for concentrating and directing said solar energy into said photovoltaic cells, and wherein said photovoltaic cells are provided on a generally circular panel positioned on said first rotatable member.

7. A method of operating photovoltaic cells at a lower temperature, comprising:
    providing an apparatus comprising:
        said photovoltaic cells provided on a first rotatable member;
        an electric motor rigidly connected to and in electric communication with said photovoltaic cells on a first side of said electric motor, wherein said electric motor is coaxially disposed in an annular space defined by said first rotatable member;
        said electric motor having an axial shaft that extends from a second side of said electric motor opposite to said first side to an impeller;

said impeller coaxially connected to said axial shaft; and said impeller housed on a second rotatable member;

capturing solar energy by said photovoltaic cells and converting said captured solar energy into electrical energy, wherein said electrical energy is transferred to said electric motor;

converting said electrical energy into mechanical energy by said electric motor for rotating said first rotatable member and said photovoltaic cells housed on said first rotatable member in a first direction about a central axis, and for rotating said axial shaft and said impeller housed on said second rotatable member in a second direction counter to said first direction about said central axis; and said impeller inside said apparatus receiving air from below said apparatus through a plurality of vents in said second rotatable member, said impeller generating an air-flow, wherein said air-flow reaches a top of said apparatus through a plurality of vents in said first rotatable member;

whereby said photovoltaic cells on said first rotatable member are cooled by said air-flow on top and bottom of said rotating photovoltaic cells, enabling said photovoltaic cells to operate at said lower temperature.

8. An apparatus for enabling photovoltaic cells to operate at a lower temperature, comprising:

a first rotatable member, said first rotatable member comprising a generally circular upper section and a curved side wall, wherein said generally circular upper section is defined between an inner periphery and an outer periphery, wherein said curved side wall of said first rotatable member is connected to said outer periphery of said generally circular upper section to define an annular space within said first rotatable member, wherein said inner periphery of said generally circular upper section defines a generally circular axial opening;

said photovoltaic cells positioned within said generally circular axial opening and on said generally circular upper section of said first rotatable member, wherein said photovoltaic cells capture solar energy and convert said solar energy into electrical energy, wherein said electrical energy is transferred to an electric motor having an axial shaft;

said electric motor rigidly connected to and in electric communication with said photovoltaic cells on a first side of said electric motor, wherein said electric motor is coaxially disposed in said annular space defined by said first rotatable member, wherein said axial shaft extends downwards from a second side of said electric motor opposite to said first side and is connected to an impeller, wherein said electric motor converts said electrical energy produced by said photovoltaic cells into mechanical energy for rotating said rigidly connected photovoltaic cells and said first rotatable member about a central axis in a first direction, and wherein said electric motor converts said electrical energy produced by said photovoltaic cells into said mechanical energy for rotating said axial shaft in a second direction counter to said first direction; and a second rotatable member rigidly connected to said impeller, wherein said rotating axial shaft rotates said impeller and said second rotatable member in said second direction at high revolutions per minute;

said first rotatable member and said second rotatable member comprising a plurality of vents, wherein said plurality of vents on said second rotatable member allow air to enter said apparatus from below said apparatus, wherein said impeller generates an air-flow using air present within said apparatus and directs said air-flow towards said rotating photovoltaic cells, and wherein said air-flow reaches a top of said apparatus through said plurality of vents on said first rotatable member;

whereby said photovoltaic cells on said first rotatable member are cooled by said air-flow on top and bottom of said rotating photovoltaic cells, enabling said photovoltaic cells to operate at said lower temperature.

\* \* \* \* \*